(12) United States Patent
Ko

(10) Patent No.: US 6,426,678 B1
(45) Date of Patent: Jul. 30, 2002

(54) HIGH POWER AMPLIFIER SYSTEM HAVING LOW POWER CONSUMPTION AND HIGH DYNAMIC RANGE

(75) Inventor: Jin-su Ko, Yongin (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/930,345

(22) Filed: Aug. 15, 2001

(30) Foreign Application Priority Data

Jan. 18, 2001 (KR) ............................................. 2001-2957

(51) Int. Cl.$^7$ ................................................ H03F 3/04
(52) U.S. Cl. ........................................ 330/296; 330/261
(58) Field of Search ..................................... 330/296, 261

(56) References Cited

U.S. PATENT DOCUMENTS

| | | | | |
|---|---|---|---|---|
| 5,929,759 A | * | 7/1999 | Charrier | 340/555 |
| 6,222,415 B1 | * | 4/2001 | Umeyama | 330/252 |
| 6,265,943 B1 | * | 7/2001 | Dening et al. | 330/296 |

* cited by examiner

Primary Examiner—Benny Lee
Assistant Examiner—Henry Choe
(74) Attorney, Agent, or Firm—F. Chau & Associates, LLP

(57) ABSTRACT

A high power amplifier system having low electric power consumption and a high dynamic range is provided. The high power amplifier system receives at least one control signal for enabling selection of the maximum current and the minimum current, reference voltage, control voltage for controlling gain and an input signal and then selects the maximum and minimum currents in response to at least one control signal. If the control voltage for controlling gain, that is, the gain of an output signal with respect to an input signal has a high voltage value within a range between the maximum current and the minimum current, the high power amplifier system magnifies the amount of current flowing in an amplification circuit therein. If the control voltage for controlling gain, that is, the gain of an output signal with respect to an input signal is low, the high power amplifier system reduces the amount of current flowing in the amplification circuit. As a result, the high power amplifier system keeps a high dynamic range within a predetermined voltage range of the control voltage and enables a particular amount of current to flow in case the control voltage is over the predetermined voltage range, thereby minimizing the amount of current flowing therein.

6 Claims, 3 Drawing Sheets

HIGH POWER AMPLIFIER SYSTEM HAVING LOW POWER CONSUMPTION AND HIGH DYNAMIC RANGE

BACKGROUND

1. Technical Field

The present invention relates to an amplifier, and more particularly, to a high power amplifier system employed in, e.g., a transmitting portion of a code division multiple access (CDMA) terminal, which provides high dynamic range and minimizes power consumption.

2. Description of Related Art

Code division multiple access (CDMA) is a method for providing multiple-access within the same frequency using spread spectrum technology. Most CDMA functions are embodied in hardware and software in a modem chip and every radio frequency (RF) circuit comprises a plurality of monolithic microwave integrated circuit (MMIC) chips. Each of the MMIC chips is a high-frequency integrated circuit that is manufactured by forming passive devices such as resistors, inductors and capacitors, as well as active devices such as transistors and a field effect transistors (FET), on one semiconductor substrate. MMIC chips can perform a variety of functions such as signal amplification and frequency conversion.

Prior to transmission of a signal from a terminal to a base station, the signal is preferably passed through an RF filter and then amplified to an appropriate level. Signal amplification is typically performed using a variable gain amplifier (VGA).

FIG. 1 is a circuit diagram of a conventional variable gain amplifier. The variable gain amplifier comprises three transistors NPN1, NPN2 and NPN3 and two impedance components $Z_L$ and $Z_e$. The transistor NPN3 has a base that receives an alternating current (AC) input signal Vin that varies about a fixed direct current (DC) bias voltage Vs. Control voltages having a potential difference $\Delta V$ are input to the bases of transistors NPN1 and NPN2 to control the gain of the variable gain amplifier. The two impedance components $Z_L$ and $Z_e$ are employed for controlling the gain of the variable gain amplifier. The voltage gain $A_V$ of an output signal $V_O$ with respect to the input signal Vin of the circuit can be expressed by formula (1):

$$A_V = \frac{V_O}{Vin} \cong \frac{g_m Z_L}{1 + g_m Z_e} \times \frac{1}{1 + e^{-\frac{\Delta V}{V_T}}} \quad (1)$$

where $$g_m = \frac{I_{ee}}{V_T}.$$

Referring to formula (1) and FIG. 1, in the conventional variable gain amplifier, the bias current $I_{ee}$ is fixed to a particular level by the DC bias voltage $V_S$, and thus, the gain $A_V$ is controlled by adjustment of the potential difference $\Delta V$ between the two control voltages.

A circuit that is used in a CDMA RF transmitting portion must have sufficient linearity to satisfy recommendations on adjacent channel power ratio (ACPR). ACPR indicates a ratio of the maximum value of signal power transmitted from an assigned frequency band, that is, a corresponding channel, with respect to power in a different channel affected by the signal power. Particularly, as the power of the transmitted signal becomes closer to the maximum permissible power value, it becomes increasingly difficult to satisfy the recommendations. Indeed, if output power reaches almost the maximum power value, the power of a signal affecting a peripheral frequency band increases more significantly than the power of the transmitted signal, and thus, the ACPR value decreases.

To solve this problem, a large amount of bias current should be supplied. On the other hand, in a case where the electric power of the transmitted signal is low, the ACPR value increases, so that the ACPR recommendations can be sufficiently satisfied.

One requirement of the ACPR recommendations, however, is for a transmitted signal to have a particular power value irrespective of the electric power of the transmitted signal. Thus, in the prior art, a considerable amount of bias current $I_{ee}$ should continually be supplied to the amplification circuit in order to satisfy the ACPR recommendations. Consequently, the conventional amplification scheme provides a disadvantage in terms of electric power consumption.

SUMMARY OF THE INVENTION

To solve the above problems, it is an object of the present invention to provide a high power amplification system which has a sufficient dynamic range to satisfy ACPR recommendations and is capable of minimizing power consumption.

Accordingly, to achieve the above object, there is provided a high power amplifier system including a voltage-to-current converter which outputs current in proportion to the difference voltage between a reference voltage and a first control voltage for controlling gain; a difference voltage generator which outputs a second control voltage and a third control voltage in response to the output current of the voltage-to-current converter, wherein the difference between the second control voltage and third control voltage is the same as the difference between the reference voltage and the first control voltage; a bias control circuit which outputs bias control current through an output terminal in response to the output current of the voltage-to-current converter and at least one control signal; a resistance component having one end to which the output current of the bias control circuit is applied and the other end which is connected to an input terminal; and an amplification circuit amplifying the input signal which is received through the input terminal and varies about the output current of the bias control circuit applied through the resistance component in response to the second and third control voltages. The bias control circuit magnifies the amount of current flowing in the amplification circuit in a case where the first control voltage, that is, the gain of the amplification circuit, has a high voltage value within a predetermined voltage range, reduces the amount of current flowing in the amplification circuit in a case where the first control voltage, that is, the gain of the amplification circuit, is low and controls the bias control current in order to make a particular amount of current flow in a case where the first control voltage is over the predetermined voltage range. Therefore, the bias control circuit makes the bias control current maintain superior linearity within a predetermined voltage range of the first control voltage. In addition, in a case the first control voltage is over the predetermined voltage range, the bias control circuit controls the bias control current so that a particular amount of current can flow in the amplification circuit, and thus the current flowing in the amplification circuit can be minimized.

In another aspect of the present invention, the bias control circuit comprises a maximum/minimum current selection circuit which receives at least one control signal, selects the maximum current and the minimum current, outputs the selected maximum current and introduces the difference current between the maximum current and the minimum current; a first difference current generating circuit which supplies the difference current between the maximum and minimum currents to the maximum/minimum current selection circuit, and mirrors and outputs the supplied difference current; a Fermi-Dirac function generating circuit which generates current which is in proportion to the Fermi-Dirac function in response to the output current of the first difference current generating circuit and the output current of the voltage-to-current converter; and a second difference current generating circuit which generates and outputs the difference current between the output current of the Fermi-Dirac function generating circuit and the maximum current.

In yet another aspect of the present invention, the maximum/minimum current selection circuit comprises a plurality of maximum current sources which supplies the maximum currents, each of the maximum currents having a different size; a plurality of minimum current sources which supplies the minimum currents, each of the minimum currents having a different size; a first switch which selects one from among the plurality of the maximum current sources in response to a control signal; a second switch which selects one from among the plurality of the minimum current sources in response to the control signal or another control signal; a difference current entrance terminal which receives the difference current between the maximum current selected by the first switch and the minimum current selected by the second switch; a first bipolar transistor one end of which is connected to the first switch and the base of the first bipolar transistor and the other end of which is connected to supply power voltage; and a second bipolar transistor one end of which is connected to the second switch and the difference current entrance terminal, the base of which is connected to the base of the first bipolar transistor and the other end of which is connected to the supply power voltage ground.

In another aspect, the first current generating circuit comprises a first MOS transistor which one end of which is connected to supply power voltage and the other end of which is connected to the gate of the first MOS transistor and supplies the difference current between the maximum current and the minimum current selected in the maximum/minimum current selection circuit through the difference current entrance terminal, a second MOS transistor one end of which is connected to the supply power voltage and a gate of which is connected to the gate of the first MOS transistor and mirrors the difference current flowing in the first MOS transistor, a third bipolar transistor one end of which is connected to the base of the third transistor and the other end of the second MOS transistor and the other end of which is connected to the supply power voltage.

In yet another aspect, the Fermi-Dirac function generating circuit comprises a fourth bipolar transistor one end of which is connected to the supply power voltage and the base of which the output current of the voltage-to-current converter is applied to; a third MOS transistor one end of which is connected to the supply power voltage and the other end of which is connected to the gate of the third MOS transistor; a fifth bipolar transistor one end of which is connected to the other end of the third MOS transistor and the other end of which is connected to the other end of the fourth bipolar transistor; a second resistance component one end of which the output current of the voltage-to-current converter is applied to and the other end of which is connected to the base of the fifth bipolar transistor; a sixth bipolar transistor one end of which is connected to the other end of the fourth bipolar transistor and the other end of the fifth bipolar transistor, the other end of which is connected to the supply power voltage and the base of which receives the mirrored output current of the first difference current generating circuit; a first diode whose input terminal is connected to the other end of the second resistance component; and a third resistance component one end of which is connected to an output terminal of the first diode and the other end of which is connected to the supply power voltage.

In another aspect, the second current generating circuit comprises a fourth MOS transistor, a fifth MOS transistor, a seventh bipolar transistor, a sixth MOS transistor, a eighth bipolar transistor, a fifth resistance component and a fourth impedance component. One end of the fourth MOS transistor is connected to the supply power voltage and the gate of the fourth MOS transistor is connected to the gate of the third MOS transistor. One end of the fifth MOS transistor is connected to the supply power voltage and the other end of the fifth MOS transistor is connected to the gate of the fifth MOS transistor and the other end of the fourth MOS transistor. One end of the seventh bipolar transistor is connected to the other end of the fourth MOS transistor and the other end of the fifth MOS transistor and the other end of the seventh bipolar transistor is connected to the supply power voltage. The output current of the maximum/minimum current selection circuit is applied to the base of the seventh bipolar transistor. One end of the sixth MOS transistor is connected to the supply power voltage and the gate of the sixth MOS transistor is connected to the gate of the fifth MOS transistor. One end of the eighth bipolar transistor is connected to the other end of the sixth MOS transistor and an output terminal. One end of the fifth resistance component is connected to the base of the eighth bipolar transistor and the other end of the fifth resistance component is connected to the other end of the sixth MOS transistor. One end of the fourth impedance component is connected to the other end of the eighth bipolar transistor and the other end of the fourth impedance component is connected to the supply power voltage ground.

In yet another aspect of the present invention, a method for controlling bias current in an amplifier comprises the steps of: applying a control voltage to an amplifier for controlling the gain of the amplifier; generating a bias control current for biasing the amplifier; and dynamically adjusting the magnitude of the bias control current based on the magnitude of the control voltage to thereby minimize power consumption of the amplifier. Preferably, the step of dynamically adjusting the magnitude of the bias control current comprises the steps of: linearly reducing the magnitude of the bias control current as the control voltage decreases within a predetermined range of control voltages; and linearly increasing the magnitude of the bias control current as the control voltage increases within a predetermined range of control voltages. Further, the magnitude of the bias control current is maintained to a fixed value as the control voltage varies outside a predetermined range of control voltages.

In another aspect of the present invention, the step of generating a bias control current for biasing the amplifier comprises the steps of: selecting a maximum and minimum current in response to a selection control signal; generating a difference current having a magnitude substantially equal to the difference between the selected maximum and minimum currents; and generating a bias control current based on the difference current using a linear function.

These and other aspects, features, and advantages of the present invention will become apparent from the following detailed description of the preferred embodiments, which is to be read in connection with the accompanying drawings.

DETAILED DESCRIPTION OF PREFERRED EMBODIMENTS

Figure 2:
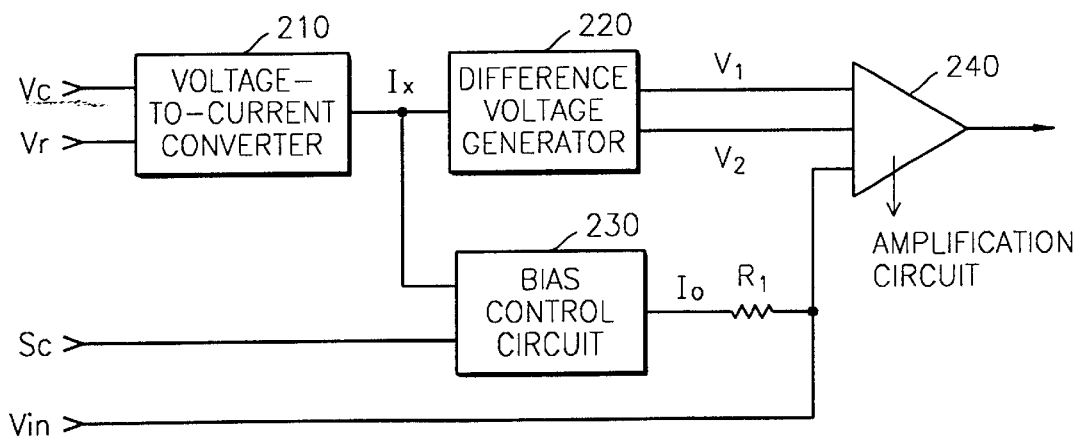
FIG. 2 is a block diagram illustrating a high power amplifier system according to an embodiment of the present invention.

FIG. 2 illustrates a high power amplifier system according to an embodiment of the present invention. A preferred high power amplifier system comprises a voltage-to-current converter 210, a difference voltage generator 220, a bias control circuit 230, a first resistance component R1 and an amplification circuit 240.

In general, the voltage-to-current converter 210 outputs a current Ix, wherein the current Ix is in proportion to the difference between reference voltage Vr and first control voltage Vc for controlling gain. The difference voltage generator 220 outputs second control voltage V1 and third control voltage V2 in response to the current Ix generated by the voltage-to-current converter 210. The bias control circuit 230 outputs bias control current Io in response to the current Ix and a control signal Sc.

The output current Io of the bias control circuit 230 flows through a resistance component R1 to an input terminal Vin of the amplification circuit 240. The resistance component is connected to the output of the bias control circuit 230 and the Vin terminal of the amplification circuit 240. In response to the second control signal V1 and the third control signal V2, the amplification circuit 240 amplifies an input signal applied to the Vin terminal. The input signal varies about a voltage generated across the first resistance component R1 by the current Io output from the bias control circuit 230.

If the gain of the amplification circuit 240 has a high voltage value within a predetermined voltage range of the first control voltage Vc (i.e., if the first control voltage Vc is high), the bias control circuit 230 generates a current Io that makes a large amount of current flow in the amplification circuit 240. On the contrary, if the gain of the amplification circuit 240 is low (i.e., if the first control voltage Vc is low), the bias control circuit 230 generates a current Io that makes a small amount of current flow in the amplification circuit 240 for the purpose of maintaining high linearity. In addition, when the first control voltage Vc is greater than the predetermined voltage range, the bias control circuit 230 reduces the current of the amplification circuit 240 to the minimum by controlling the bias control current Io to make a particular amount of current flow.

Figure 3:
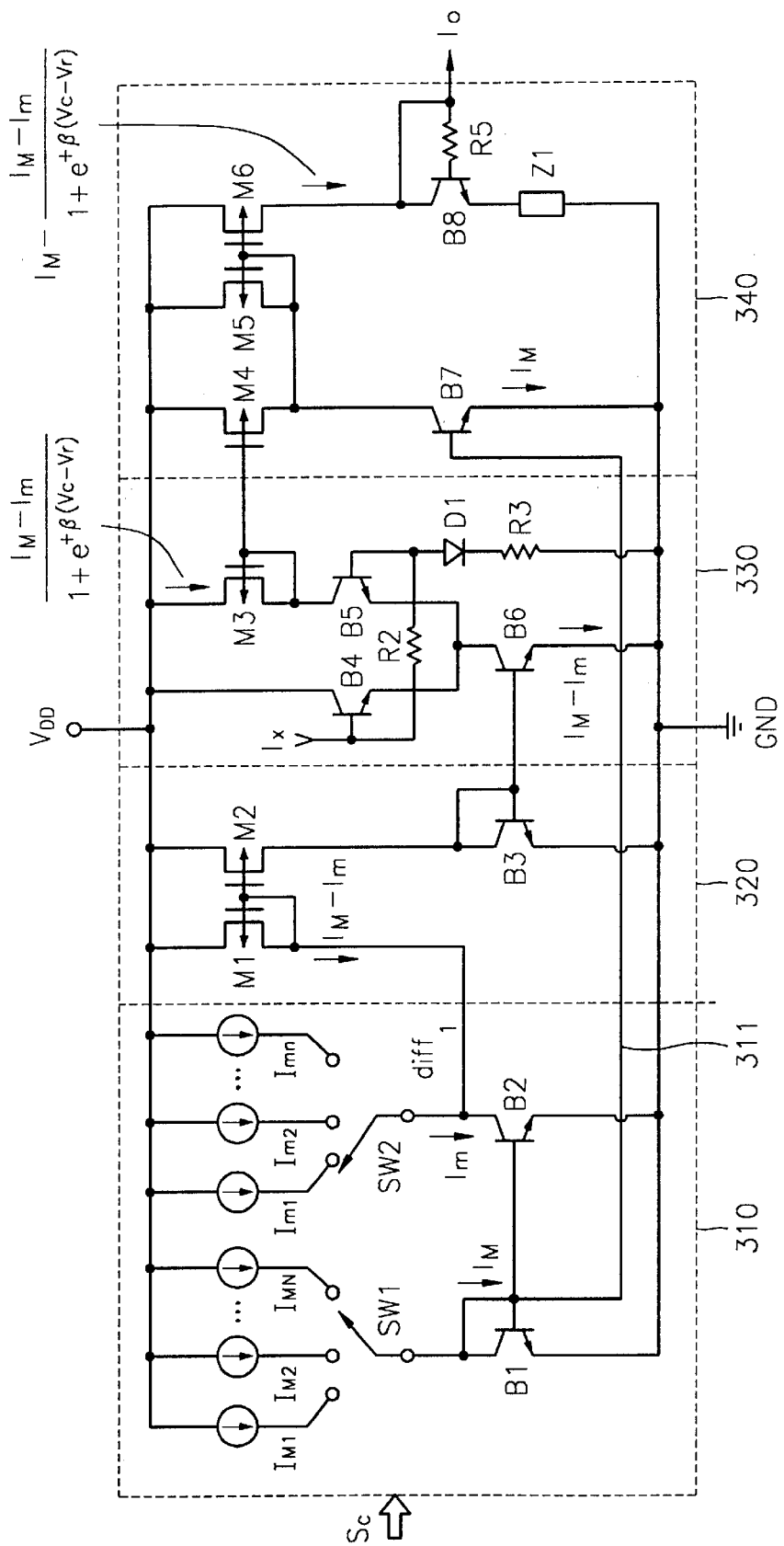
FIG. 3 is a circuit diagram of a bias control circuit illustrated in FIG. 2 according to an embodiment of the present invention.

FIG. 3 is a circuit diagram of the bias control circuit illustrated in FIG. 2 according to an embodiment of the present invention. In general, a preferred bias control circuit comprises a maximum/minimum current selection circuit 310, a first difference current generating circuit 320, a Fermi Dirac (FD) function generating circuit 330 and a second difference current generating circuit 340.

In response to a control signal Sc, the maximum/minimum current selection circuit 310 selects a maximum current $I_M$ and a minimum current $I_m$, outputs the selected maximum current $I_M$, and receives a difference current $I_M-I_m$ between the maximum current $I_M$ and the minimum current $I_m$ via terminal diff1. The first difference current generating circuit 320 supplies the difference current $I_{M-Im}$ to the maximum/minimum current selection circuit 310 through the difference current entrance terminal diff1 and mirrors the supplied current $I_M-I_m$. Then, the first difference current generating circuit 320 outputs the current $I_M-I_m$.

The FD function generating circuit 330 generates a current $$\frac{I_M - I_m}{1 + e^{\beta(V_c - V_r)}}$$

(which is in proportion to the fermi-dirac function) in response to the difference current $I_M-I_m$ of the first difference current generating circuit 320 and the output current Ix of the voltage-to-current converter. The second difference current generating circuit 340 generates and outputs a difference current $$I_M - \frac{I_M - I_m}{1 + e^{\beta(V_c - V_r)}}$$

between the output current $$\frac{I_M - I_m}{1 + e^{\beta(V_c - V_r)}}$$

of the FD function generating circuit 330 and the maximum current $I_M$.

The maximum/minimum current selection circuit 310 comprised a plurality of maximum/minimum current supply current sources $I_{M1}$ through $I_{MN}$ (where N is an integer), a plurality of minimum current supply current sources $I_{m1}$ through $I_{mn}$ (where n is an integer), a first switch SW1, a second switch SW2, a first bipolar transistor BI and a second bipolar transistor B2.

Each of the maximum current supply current sources $I_{M1}$ through $I_{MN}$ supplies a maximum current having a different size. Each of the minimum current supply current sources $I_{m1}$ through $I_{mn}$ supplies a minimum current having a different size. The first switch SW1 selects at least one of the maximum current supply current source from the plurality of maximum current supply current sources $I_{M1}$ through $I_{MN}$ in response to a control signal (not shown) among one or more control signals Sc. The second switch SW2 selects a minimum current supply current source from the plurality of minimum current supply current sources $I_{m1}$ through $I_{mn}$ in response to the control signal (not shown) or another control signal (not shown). The collector terminal of the first bipolar transistor B1 is connected to the second switch SW2 and the base terminal of B1, and the emitter terminal of B1 is connected to supply power voltage GND. The base and collector terminal of bipolar transistor B1 are connected to node 311. The collector terminal of the second bipolar transistor B2 is connected to the second switch SW2 and the difference current entrance terminal diff1 (which, as noted above, receives the difference current $I_M-I_m$ between the maximum current $I_M$ and the minimum current $I_m$ selected by the first and second switches SW1 and SW2, respectively). The base of the second bipolar transistor B2 is connected to node 311 and the emitter terminal of the second bipolar transistor B2 is connected to the supply power voltage GND.

The first current generating circuit 320 comprises a first MOS transistor M1 operatively connected to the supply power voltage $V_{DD}$ and the gate of the first MOS transistor M1 as shown, which supplies the difference current $I_M-I_m$ through the difference current entrance terminal diff1. The first current generating circuit 320 further comprises a second MOS transistor M2 operatively connected to the supply power voltage $V_{DD}$ and the gate of the first MOS transistor M1 as shown. The second MOS transistor mirrors the difference current $I_M-I_m$ flowing in the first MOS transistor M1. The first current generating circuit 320 further comprises a third bipolar transistor B3 operatively connected between the second MOS transistor M2 and the supply power voltage GND as shown.

The FD function generating circuit 330 comprises a fourth bipolar transistor B4, a third MOS transistor M3, a fifth bipolar transistor B5, a second resistance component R2, a sixth bipolar transistor B6, a first diode D1 and a third resistance component R3. The collector terminal of the fourth bipolar transistor B4 is connected to the supply power voltage $V_{DD}$. The output current Ix of the voltage-to-current converter 210 is applied to the base of the fourth bipolar transistor B4. One terminal of the third MOS transistor M3 is operatively connected to the supply power voltage $V_{DD}$ and another terminal of the third MOS transistor M3 is connected to the gate of the third MOS transistor M3. The collector of the fifth bipolar transistor B5 is connected to the third MOS transistor M3 and the emitter of the fifth bipolar transistor B5 is connected to the emitter of the fourth bipolar transistor B4. The current Ix (which is output from the voltage-to-current converter 210) is applied to the second resistance component R2 which is connected to the base terminal of the fifth bipolar transistor B5. The collector terminal of the sixth bipolar transistor B6 is connected to the emitter terminals of the fourth and fifth bipolar transistors B4, B5, the emitter terminal of the sixth bipolar transistor B6 is connected to the supply power voltage GND and the base terminal of the sixth bipolar transistor B6 is connected to the base terminal of the third bipolar transistor B3. The input terminal of the first diode D1 is connected to the second resistance component R2 and the base terminal of the fifth bipolar transistor B5. The third resistance component R3 is connected between an output terminal of the first diode D1 and the supply power voltage GND.

The second current generating circuit 340 comprises a fourth MOS transistor M4, a fifth MOS transistor M5, a seventh bipolar transistor B7, a sixth MOS transistor M6, an eighth bipolar transistor B8, a fifth resistance component R5 and a fourth impedance component Z1. The fourth MOS transistor M4 is connected to the supply power voltage $V_{DD}$ and the gate terminal of the fourth MOS transistor M4 is connected to the gate of the third MOS transistor M3. One terminal of the fifth MOS transistor M5 is connected to the supply power voltage $V_{DD}$ and the other terminal of the fifth MOS transistor M5 is operatively connected to the gate of the fifth MOS transistor M5 and a terminal of the fourth MOS transistor M4 as shown. The collector terminal of the seventh bipolar transistor B7 is connected to the fourth MOS transistor M4 and the fifth MOS transistor M5 as shown, and the emitter of the seventh bipolar transistor B7 is connected to the supply power voltage GND. The output current $I_M$ of the maximum/minimum current selection circuit 310 is applied to the base terminal of the seventh bipolar transistor B7 via node 311. One terminal of the sixth MOS transistor M6 is connected to the supply power voltage $V_{DD}$ and the gate of the sixth MOS transistor M6 is connected to the gate of the fifth MOS transistor M5. The collector terminal of the eighth bipolar transistor B8 is connected to the sixth MOS transistor M6 and an output terminal Io. The fifth resistance component R5 is connected to the base terminal of the eighth bipolar transistor B8 and the sixth MOS transistor M6. The fourth impedance component Z1 is connected between the emitter terminal of the eighth bipolar transistor B8 and the supply power voltage GND.

Figure 1:
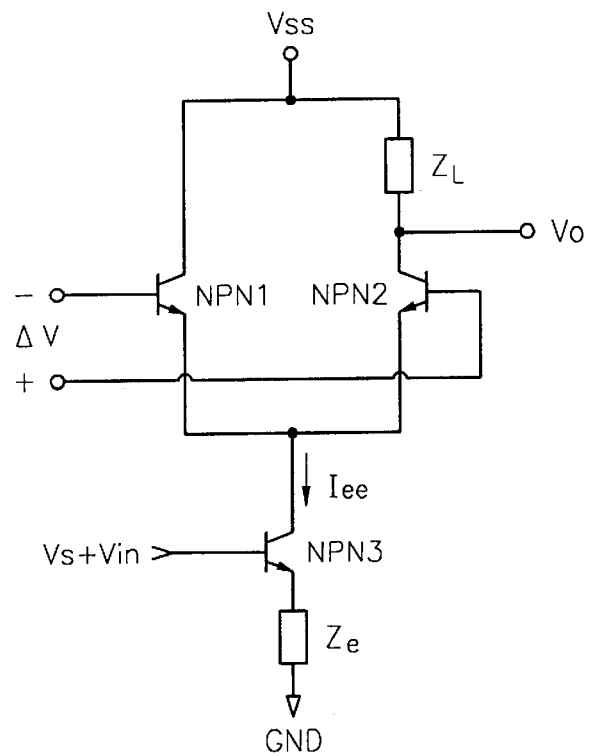
FIG. 1 is a circuit diagram of a conventional variable gain amplifier.

In the conventional variable gain amplifier illustrated in FIG. 1, after a degeneration inductor is loaded in the impedance component Ze connected to the emitter of the NPN transistor NPN3, the conventional variable gain amplifier is operated at a high frequency $$\left(\omega L_e \gg \frac{1}{g_m}\right)$$

of about 1 Ghz. In this situation, the gain of the variable gain amplifier is not sensitive to the bias current Iee. Advantageously, a high power amplifier system according to an embodiment of the present invention provides a mechanism for varying the bias current Iee depending on the control voltage Vc. This mechanism allows the high power amplifier system to have a high dynamic range due to a uniform gain gradient and affords a reduction in the power consumption.

If the gain is high within a predetermined voltage range of the first control voltage, in other words, if the first control voltage is high, the bias current is made to be high. If the gain is low, the bias current is reduced. On the other hand, if the first control voltage is over or below a particular voltage level, the bias current is fixed to a predetermined value, thereby making the circuit operate like an AB-class of amplifier. Here, the predetermined voltage range of the first control voltage is determined by the maximum and minimum current values.

The bias current is fixed to either the maximum or the minimum within the predetermined range of the first control voltage, thereby obtaining superior linearity. In the present invention, current obtained from formula (2) is made to flow so that the bias current has a monotonic function relationship to prevent discontinuity and enable formation of a circuit.

$$I_{ee} = \frac{I_M - I_m}{1 + e^{+\beta(V_c - V_r)}} \quad (2)$$

To obtain a desired value from formula (2), the two difference current generating circuits 320 and 340 and the FD function generating circuit 330 are combined together. Referring to FIG. 2, a high dynamic range can be obtained in a low power consumption state by using the output voltages V1 and V2 of the difference voltage generator 220 or operating the amplifier circuit 240 through adjustment of the bias control circuit 230.

Particularly, in a case where the high power amplifier system is used in an output driver of a CDMA terminal, the control voltage Vc is connected to a mobile station modem (MSM). Then, if there is no considerable change in the gain and the output voltage is high, the high power amplifier system is operated like a class-AB mode, thereby enhancing linearity. If the output voltage is low, noise is reduced, thereby obtaining a high dynamic range in a low power consumption state.

Figure 4:
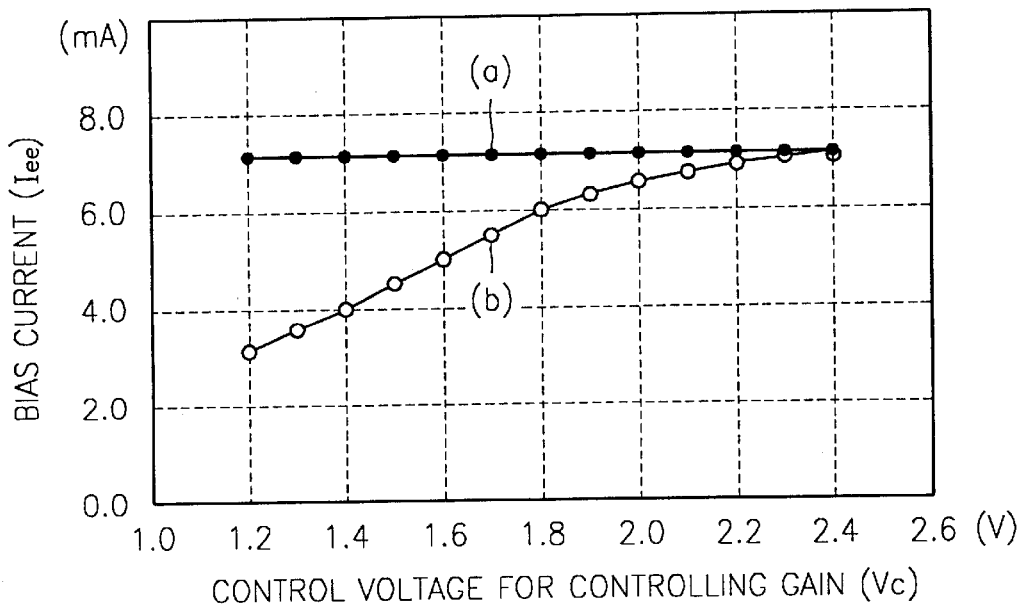
FIG. 4 is an exemplary graphical diagram illustrating a relationship between bias current and control voltage for controlling gain.

FIG. 4 is an exemplary graphical diagram illustrating the relationship between control voltage Vc for controlling gain and bias current Iee. As shown in FIG. 4, according to the conventional method, the bias current (a) of a fixed amount (e.g., 7 mA) should be supplied irrespective of the control voltage Vc for controlling gain. However, in accordance with an embodiment of the present invention, the bias current (b) varies from, e.g., 3 mA to 7 mA depending on the control voltage Vc for controlling gain, thereby minimizing power consumption.

Figure 5:
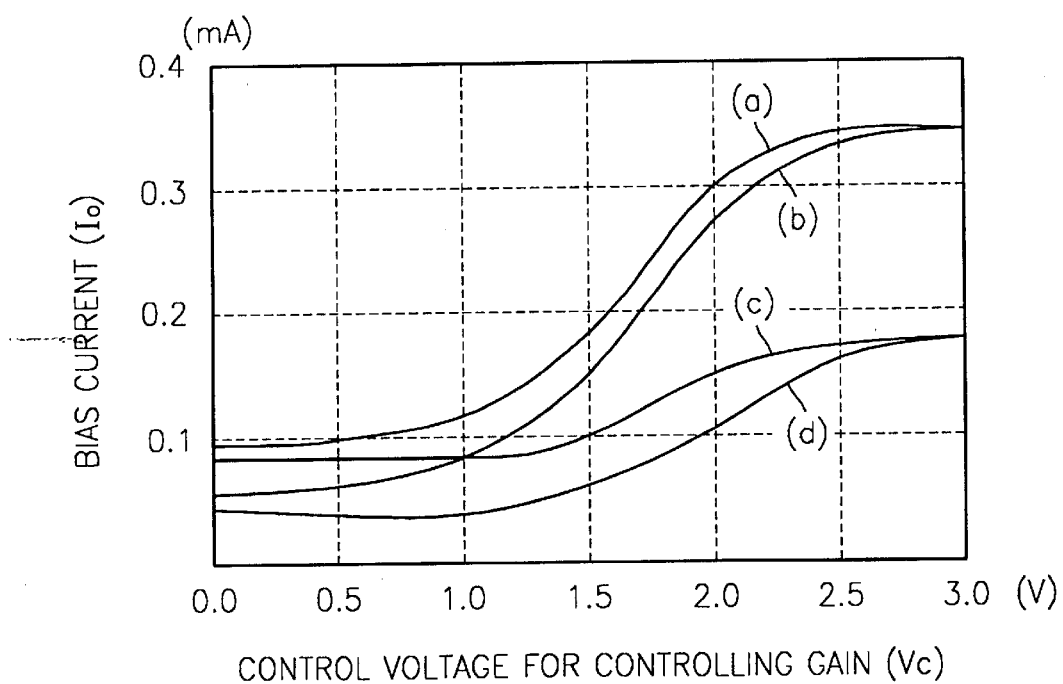
FIG. 5 is a waveform diagram illustrating results of a computer simulation of the circuit illustrated in FIG. 3.

FIG. 5 is a waveform diagram illustrating results of computer simulation of the circuit illustrated in FIG. 3, wherein the magnitude of $I_{m1}$, $I_{m2}$, $I_{M1}$, and $I_{M2}$ are adjusted to 0.04 mA, 0.08 mA, 0.18 mA and 0.36 mA, respectively. In the case of the curve (a), $I_{m2}$ and $I_{M2}$ are fixed to 0.08 mA and 0.36 mA, respectively. In the case of the curve (b), $I_{m1}$ and $I_M 2$ are fixed to 0.04 mA and 0.36 mA, respectively. In the case of the curve (c), $I_{m2}$ and $I_{M1}$ are fixed to 0.08 mA and 0.18 mA, respectively. In the case of the curve (d), $I_{m1}$ and $I_{M1}$ 1 are fixed to 0.04 mA and 0.18 mA, respectively. Under these conditions, if the control voltage Vc is increased, bias current is determined to be a particular value between the selected minimum and maximum current values. If the control voltage Vc is over 2.5 V, the bias current has a fixed current value and shows class-AB output characteristics.

While this invention has been particularly shown and described with reference to preferred embodiments thereof, it will be understood by those skilled in the art that various changes in form and details may be made therein without departing from the spirit and scope of the invention as defined by the appended claims.

As described above, the high power amplifier system according to the present invention selects the maximum current and the minimum current depending on a control signal and controls the amount of current depending on the degree to which an input signal is amplified and outputted. Therefore, a high power amplifier system according to an embodiment of the present invention provides low electric power consumption with a high dynamic range.

What is claimed is:

1. A high power amplifier system, comprising:
a voltage-to-current converter for generating a first control current in proportion to the difference voltage between a reference voltage and a first control voltage for controlling gain;
a difference voltage generator which outputs a second control voltage and a third control voltage in response to the first control current, wherein the difference between the second control voltage and third control voltage is substantially similar to the difference between the reference voltage and the first control voltage;
a bias control circuit which generates a bias control current in response to the first control current and at least one control signal;
a resistance component connected to the output of the bias control circuit and an input terminal; and
an amplification circuit for amplifying an input signal which is received through the input terminal in response to the second and third control voltages, wherein the input signal varies about a bias voltage generated by applying the bias control current through the resistance component, wherein the bias control circuit increases the magnitude of the bias current flowing in the amplification circuit as the magnitude of the first control voltage increases within a predetermined range of control voltages, wherein the bias control circuit decreases the magnitude of the bias current flowing in the amplification circuit when the as the magnitude of the first control voltage decreases within the predetermined range of control voltages, and wherein the bias control circuit controls the bias control current to generated a fixed magnitude bias current flow in the amplification circuit when the magnitude of the first control voltage is outside the predetermined range of control voltages.

2. The high power amplifier system of claim 1, wherein the bias control circuit comprises:
a maximum/minimum current selection circuit which, in response to at least one control signal, selects a maximum current and a minimum current, and outputs the selected maximum current;
a first difference current generating circuit which generates and mirrors a first difference current between the selected maximum and minimum currents, and outputs the first difference current to the maximum/minimum current selection circuit;
a Fermi-Dirac function generating circuit which generates a current substantially in proportion to the Fermi-Dirac function in response to the first difference current and the first control current output from the voltage-to-current converter; and
a second difference current generating circuit which generates and outputs a second difference current between the selected maximum current and the output current of the Fermi-Dirac function generating circuit.

3. The high power amplifier system of claim 2, wherein the maximum/minimum current selection circuit comprises:
a plurality of maximum current sources each supplying a maximum current of a different magnitude;
a plurality of minimum current sources each supplying a minimum current of a different magnitude;
a first switch for selecting one of the maximum current sources in response to a control signal;
a second switch for selecting one of the minimum current sources in response to a control signal;
an input terminal which receives the first difference current;
a first bipolar transistor operatively connected to the first switch and supply power ground, wherein the collector and base of the first bipolar transistor are connected; and
a second bipolar transistor operatively connected to the second switch and supply power ground, wherein the base of the second bipolar transistor is connected to the base of the first bipolar transistor, and wherein the collector of the second bipolar transistor is connected to the input terminal.

4. The high power amplifier system of claim 2, wherein the first difference current generating circuit comprises:
a first MOS transistor, operatively connect to supply power voltage and the maximum/minimum current selection circuit, for supplying the first difference current to the maximum/minimum current selection circuit through a difference current entrance terminal;
a second MOS transistor, operatively connected to supply power voltage and the first MOS transistor, for mirroring the first difference current flowing in the first MOS transistor;

a third bipolar transistor, operatively connected to the second MOS transistor and supply power voltage ground, wherein the base and collector of the third bipolar transistor are connected.

5. The high power amplifier system of claim 2, wherein the Fermi-Dirac function generating circuit comprises:

a fourth bipolar transistor operatively connected to supply power voltage, wherein the base of the fourth bipolar transistor receives as input the first control current output from the voltage-to-current converter;

a third MOS transistor operatively connected to supply power voltage;

a fifth bipolar transistor operatively connected to the third MOS transistor and the fourth bipolar transistor;

a second resistance component, connected to the base of the fourth and fifth bipolar transistors, wherein the first control current output from the voltage-to-current converter is applied to the second resistance component;

a sixth bipolar transistor, operatively connected to the fourth and fifth bipolar transistors and supply power voltage ground, wherein the base of the sixth bipolar transistor is operatively connected to the first difference current generating circuit for receiving the mirrored first difference current;

a first diode, operatively connected to the second resistance component; and a third resistance component, operatively connected to the output of the first diode and supply power voltage ground.

6. The high power amplifier system of claim 5, wherein the second difference current generating circuit comprises:

a fourth MOS transistor operatively connected to supply power voltage and the third MOS transistor;

a fifth MOS transistor operatively connected to supply power voltage and the fourth MOS transistor;

a seventh bipolar transistor operatively connected to the fourth MOS transistor, the fifth MOS transistor and supply power voltage ground, wherein output of the maximum/minimum current selection circuit is connected to the base of the seventh bipolar transistor;

a sixth MOS transistor operatively connected to the gate of the fifth MOS transistor, supply power voltage and an output terminal of the bias control circuit;

an eighth bipolar transistor operatively connected to the sixth MOS transistor and the output terminal of the bias control circuit;

a fifth resistance component operatively connected to the base of the eighth bipolar transistor and the output terminal of the bias control circuit; and a fourth impedance component operatively connected to the eighth bipolar transistor and the supply power voltage ground.

* * * * *